United States Patent [19]

Sivilotti et al.

[11] Patent Number: 5,103,116

[45] Date of Patent: Apr. 7, 1992

[54] CMOS SINGLE PHASE REGISTERS

[75] Inventors: Massimo Sivilotti, Encinitas; Carver A. Mead, Pasadena, both of Calif.

[73] Assignee: California Institute of Technology, Pasadena, Calif.

[21] Appl. No.: 685,598

[22] Filed: Apr. 15, 1991

[51] Int. Cl.[5] .................... H03K 1/53; H03K 17/284
[52] U.S. Cl. ................................ 307/272.2; 307/279; 307/452; 377/79; 377/117
[58] Field of Search .................. 307/272.1, 272.2, 530, 307/279, 451, 452, 453, 480; 377/74, 79, 105, 117, 121

[56] References Cited

U.S. PATENT DOCUMENTS

| | | | |
|---|---|---|---|
| 4,512,029 | 4/1985 | Brice | 307/272.2 |
| 4,716,312 | 12/1987 | Mead et al. | 307/279 |
| 5,049,760 | 9/1991 | Ooms | 307/272.2 |

*Primary Examiner*—Timothy P. Callahan
*Attorney, Agent, or Firm*—Kenneth D'Alessandro

[57] ABSTRACT

A CMOS single phase register includes two pairs of cross coupled CMOS inverters connected together by transistor switches. The first pair of cross-coupled CMOS inverters is connected to a complementary pair of data inputs through a first pair of transistor switches which turn on in response to a first logic level. The complementary outputs of the first pair of cross-coupled CMOS inverters is connected to the inputs of the second pair of cross-coupled CMOS inverters through a second pair of transistor switches which turn on in response to a second logic level. The complementary outputs of the CMOS single phase register of the present invention are the outputs of the second pair of cross-coupled CMOS inverters. The ground connections of the first pair of cross-coupled CMOS inverters is made through a transistor switch which turns on in response to the first logic level. The positive voltage supply connections of the second pair of cross-coupled CMOS inverters is made through a transistor switch which turns on in response to the second logic level. A single clock line is connected to the gates of all of the transistor switches.

8 Claims, 2 Drawing Sheets

5,103,116

CMOS SINGLE PHASE REGISTERS

The invention described herein was made in the performance of work funded in part by the Office of Naval Research of the United States Government, and the United States Government has certain rights in the invention under Public Law 96-517 (35 U.S.C. S202).

BACKGROUND OF THE INVENTION

1. Field Of The Invention

The present invention relates to CMOS logic circuits. More particularly, the present invention relates to clocked register logic circuits.

2. The Prior Art

Numerous sequential logic circuits are in common use. Such circuits employ various clocking schemes. Some known register circuits employ single phase clocks. Other known register circuits, such as the circuit disclosed and claimed in U.S. Pat. No. 4,716,312 to Mead et al. employ two-phase clocks.

The various clocking schemes employed for use in CMOS register circuits offer various tradeoffs. In one single phase clock scheme, a single phase clock and its complement are distributed and are used to control either transmission gates or transistors controlling power to P-channel and N-channel transistor switching networks. Proper operation of such circuits requires that the logic delay of the stage exceed the clock skew between the two clock lines. An approach having relaxed clocking requirements utilizes a two-phase clock in which two different phase clock signals and their complements are distributed. The reduced risk of this circuit is achieved at the expense of more complex clock waveform generation. Another popular form of register used in gate-level designs employs a single phase distributed clock which is locally inverted at master-slave elements. While this approach results in a low risk circuit, it does so at the expense of requiring at least ten devices per minimum storage element.

BRIEF DESCRIPTION OF THE INVENTION

According to a first aspect of the present invention, a static CMOS single phase register includes two pairs of cross coupled CMOS inverters connected together by transistor switches. The first pair of cross-coupled CMOS inverters is connected to a complementary pair of data inputs through a first pair of transistor switches which turn on in response to a first logic level. The complementary outputs of the first pair of cross-coupled CMOS inverters is connected to the inputs of the second pair of cross-coupled CMOS inverters through a second pair of transistor switches which turn on in response to a second logic level. The complementary outputs of the CMOS single phase register of the present invention are the outputs of the second pair of cross-coupled CMOS inverters. The ground connections of the first pair of cross-coupled CMOS inverters is made through a transistor switch which turns on in response to the first logic level. The positive voltage supply connections of the of the second pair of cross-coupled CMOS inverters is made through a transistor switch which turns on in response to the second logic level. A single clock line is connected to the gates of all of the transistor switches.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
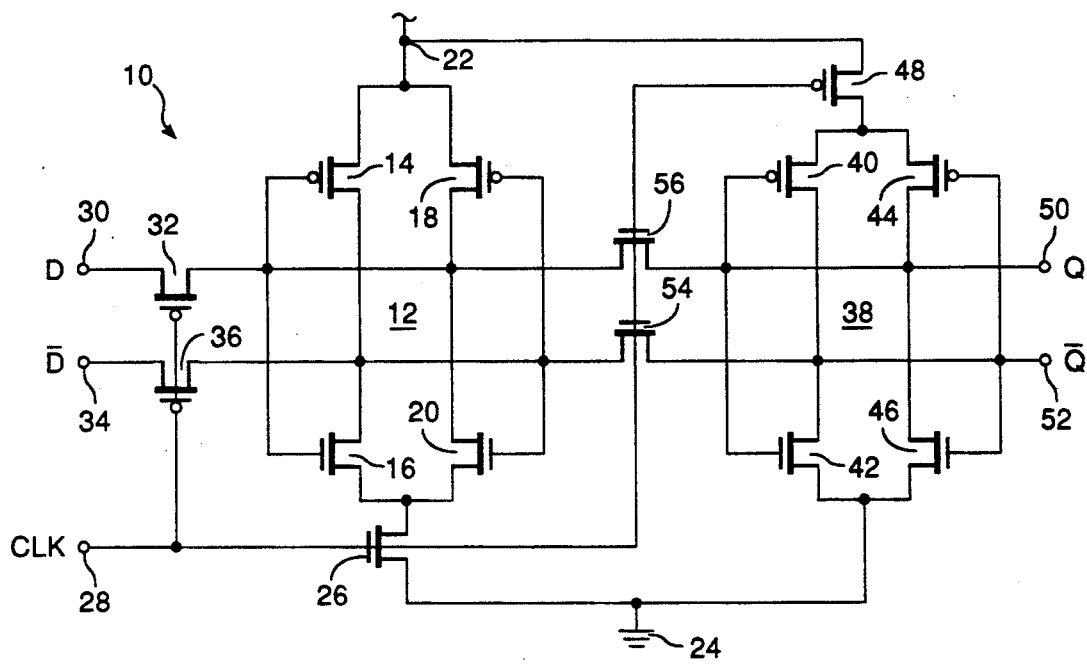
FIG. 1 is a schematic diagram of a CMOS single phase register according to a presently preferred embodiment of the invention.

Referring first to FIG. 1, a static CMOS single phase register circuit 10 according to the present invention is depicted in schematic diagram form. A first pair of CMOS inverters 12 includes a first inverter including P-channel MOS transistor 14 and an N-channel MOS transistor 16 and a second inverter including P-channel MOS transistor 18 and N-channel MOS transistor 20. The sources of P-channel MOS transistors 14 and 20 are connected to a first power supply rail 22. The drains of N-channel MOS transistors 16 and 20 are connected to a second power supply rail 24 (shown as ground in FIG. 1) through an N-channel switching transistor 26 having its gate connected to clock node 28.

The gates of MOS transistors 14 and 16 are connected to the drains of MOS transistors 18 and 20 and the gates of MOS transistors 18 and 20 are connected to the drains of MOS transistors 14 and 16. The first and second inverters are thus cross-coupled to one another.

A first complementary data input node 30 is connected to the input of the inverter comprising transistors 14 and 16 through a first P-channel pass transistor 32. The gate of first P-channel pass transistor 32 is connected to clock node 28.

A second complementary data input node 34 is connected to the input of the inverter comprising transistors 18 and 20 through a second P-channel pass transistor 36. The gate of second P-channel pass transistor 36 is connected to clock node 28.

A second pair of CMOS inverters 38 includes a third inverter including P-channel MOS transistor 40 and an N-channel MOS transistor 42 and a fourth inverter including P-channel MOS transistor 44 and N-channel MOS transistor 46. The sources of N-10 channel MOS transistors 42 and 46 are connected to the second power supply rail 24. The sources of P-channel MOS transistors 40 and 44 are connected to first voltage rail 22 through a P-13 channel switching transistor 48 having its gate connected to clock node 28.

The gates of MOS inverter transistors 40 and 42 are connected to the drains of MOS inverter transistors 44 and 46 and the gates of MOS inverter transistors 44 and 46 are connected to the drains of MOS inverter transistors 40 and 42. The third and fourth inverters are thus cross-coupled to one another. The common drain connection of MOS inverter transistors 44 and 46 forms a first data output node 50 of the CMOS single phase register circuit 10 of the present invention. The common drain connection of MOS inverter transistors 40 and 42 forms a second data output node 52 of the register circuit.

The output of the first inverter (the common drain connection of MOS transistors 14 and 16) is connected to the input of the fourth inverter (the common gate connection of MOS transistors 44 and 46 through a first N-channel pass transistor 54. The gate of first N-channel MOS pass transistor 54 is connected to clock node 28.

The output of the second inverter (the common drain connection of MOS transistors 18 and 20) is connected to the input of the third inverter (the common gate connection of MOS transistors 40 and 42 through a second N-channel pass transistor 56. The gate of second N-channel MOS pass transistor 56 is connected to clock node 28.

The static CMOS single phase register circuit of the present invention operates based on complementary set-reset logic implemented in the cross-coupled inverters. When the clock node 28 is high, N-channel MOS switching transistor 26 is turned on and the first and second cross-coupled inverter pair 12 is connected to both power supply rails. P-channel MOS pass transistors 32 and 36 are turned off, thus disconnecting the first cross coupled inverter pair 12 from the complementary data input nodes 30 and 34. Because the inverters are cross coupled, they are latched and stable. The latch is thus totally static, and can be left with the clock high for an indefinite period without loss of data. N-channel MOS pass transistors 54 and 56 are turned on, thus connecting the outputs of the first cross coupled inverter pair to complementary data output nodes 50 and 52.

Because P-channel MOS switching transistor 48 is off, the third and fourth cross-coupled inverter pair 38 is disconnected from the power supply by interruption of the positive voltage rail connection.

When the clock node 28 is low, N-channel MOS switching transistor 26 is turned off and the first and second cross-coupled inverter pair 12 is thus disconnected from the negative power supply rail. P-channel MOS pass transistors 32 and 36 are turned on, thus connecting first inverter pair 12 to the complementary data input nodes 30 and 34. N-channel MOS pass transistors 54 and 56 are turned off, thus disconnecting the outputs of the first cross-coupled inverter pair from the complementary data output nodes 50 and 52.

Because P-channel MOS switching transistor 48 is on, the third and fourth cross-coupled inverter pair 38 is connected to the positive power supply voltage rail. The second inverter pair 38 thus latches and restores the data available at complementary data output nodes 50 and 52. Because the latch is totally static, it can be left with the clock low for an indefinite period without loss of data.

In order to guarantee error-free operation of the CMOS single phase shift register of FIG. 1, the W/L ratio of the pass transistors 54 and 56 should be chosen such that, during the rising clock transition, the second stage will not alter the state of the first stage. This may be accomplished by assuring that the saturation current of the series combination of switching transistor 26 and either of inverter transistors 16 and 20 is greater than the saturation current of either one of the pass transistors 54 and 56.

If complementary data input nodes 30 and 34 are the outputs of a previous register stage, the W/L ratio of P-channel MOS pass transistors 32 and 36 should be chosen such that, on the falling clock transition, the first stage will not alter the state of the second stage of the previous register. This may be accomplished by assuring that the saturation current of the series combination of either P-channel MOS transistors 40 and 48 or 44 and 48 of the previous stage is greater than the saturation current of either of P-channel MOS pass transistors 32 or 36.

The circuit of FIG. 1 has several advantages over prior art register circuits. First, because it employs cross-coupled inverters, there is no need to derive the complementary output using an inverter. In addition, the circuit of FIG. 1 produces a lower power supply switching transient than some of the known register circuits. Finally, because the circuit of FIG. 1 is inherently a sense amplifier, it can be used to threshold an analog value to turn it into a digital value. This capability is useful in some analog applications.

Figure 2:
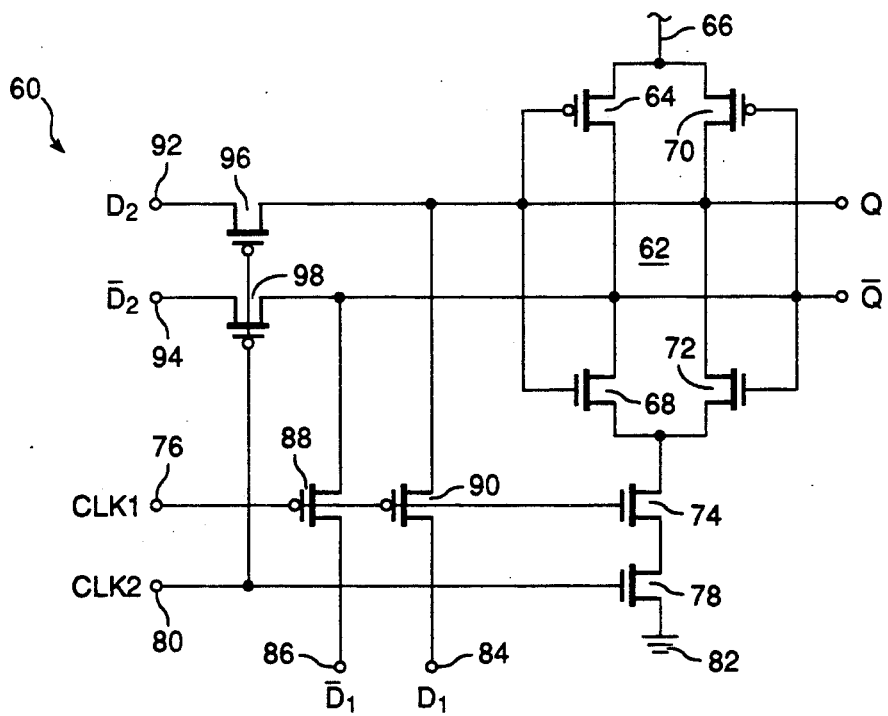
FIG. 2 is a schematic diagram of a CMOS single phase register stage useful as a shift/load register stage according to another embodiment of the invention.

Referring now to FIG. 2, a useful shift/load stage 60 which may be used with the present invention is depicted. A pair of inverters 62 includes a first inverter comprising first P-channel MOS inverter transistor 64, having its source connected to the positive voltage rail 66 and its drain connected to the drain of first N-channel MOS inverter transistor 68 to form the output node of the first inverter. The gates of inverter transistors 64 and 68 are connected together to form the input node of the first inverter.

A second inverter comprises second P-channel MOS inverter transistor 70, having its source connected to the positive voltage rail 66 and its drain connected to the drain of second N-13 channel MOS inverter transistor 72 to form the output node of the second inverter. The gates of inverter transistors 70 and 72 are connected together to form the input node of the second inverter.

The first and second inverters are cross coupled. The gates of first inverter transistors 64 and 68 are connected to the drains of second MOS inverter transistors 70 and 72. In addition, the gates of second inverter transistors 70 and 72 are connected to the drains of first MOS inverter transistors 64 and 68.

The sources of first and second N-channel inverter transistors 68 and 72 are connected together to the drain of first N-channel MOS switching transistor 74. The gate of first N-channel MOS switching transistor 74 is connected to a first clock node 76 and its source is connected to the drain of second N-channel MOS switching transistor 78. The gate of second N-channel MOS switching transistor 78 is connected to a second clock node 80 and its source is connected to the negative voltage rail 82, shown as ground in FIG. 2.

A first set of complementary data input nodes $D_1$ (reference numerals 84 and 86) are connected to the input nodes of the first and second inverters through first and second P-channel MOS pass transistors 88 and 90, having their gates commonly connected to first clock node 76. A second set of complementary data input nodes $D_2$ (reference numerals 92 and 94) are connected to the input nodes of the first and second inverters through third and fourth P-channel MOS pass transistors 96 and 98, having their gates commonly connected to second clock node 80.

The circuit of FIG. 2 may be used as the input section of a parallel-loadable shift registers stage. One set of data inputs may be used as a parallel load input and the other set of inputs may be cascaded to the output of a previous stage.

Figure 3:
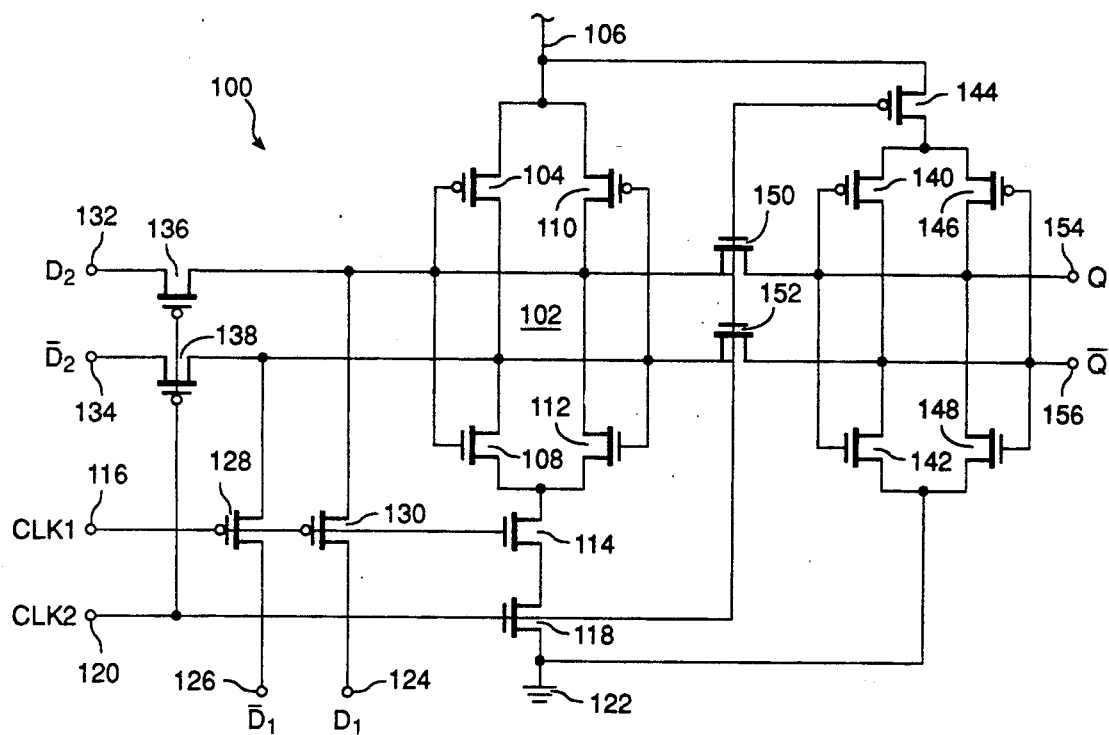
FIG. 3 is a schematic diagram of the shift/load stage of FIG. 2 cascaded with a circuit like the output section of the circuit of FIG. 1 which may serve as a single loadable shift register stage.

Such a parallel-loadable shift register stage according to a presently preferred embodiment of the invention is shown in schematic diagram for in FIG. 3. Shift register stage 100 includes a first pair of inverters 102 including a first inverter comprising first P-channel MOS inverter transistor 104, having its source connected to the positive voltage rail 106 and its drain connected to the drain of fist N-channel MOS inverter transistor 108 to form the output node of the first inverter. The gates of inverter transistors 104 and 108 are connected together to form the input node of the first inverter.

A second inverter comprises second P-channel MOS inverter transistor 110, having its source connected to the positive voltage rail 106 and its drain connected to the drain of second N-channel MOS inverter transistor 112 to form the output node of the second inverter. The gates of inverter transistors 110 and 112 are connected together to form the input node of the second inverter.

The first and second inverters are cross coupled. The gates of first inverter transistors 104 and 108 are connected to the drains of second MOS inverter transistors 110 and 112. In addition, the gates of second inverter transistors 110 and 112 are connected to the drains of first MOS inverter transistors 104 and 108.

The sources of first and second N-channel inverter transistors 108 and 112 are connected together to the drain of first N-channel MOS switching transistor 114. The gate of first N-channel MOS switching transistor 114 is connected to a first clock node 116 and its source is connected to the drain of second N-channel MOS switching transistor 118. The gate of second N-channel MOS switching transistor 118 is connected to a second clock node 120 and its source is connected to the negative voltage rail 122, shown as ground in FIG. 3.

A first set of complementary data input nodes $D_1$ (reference numerals 124 and 126) are connected to the input nodes of the first and second inverters through first and second P-channel MOS pass transistors 130 and 128, having their gates commonly connected to first clock node 116. A second set of complementary data input nodes $D_2$ (reference numerals 132 and 134) are connected to the input nodes of the first and second inverters through third and fourth P-channel MOS pass transistors 136 and 38, having their gates commonly connected to second clock node 120.

A second pair of inverters includes a third inverter comprising third P-channel MOS inverter transistor 140, having its drain connected to the drain of first N-channel MOS inverter transistor 142 to form the output node of the third inverter and one of the complementary data output nodes 156 of the register stage. The gates of inverter transistors 140 and 142 are connected together to form the input node of the third inverter. The source of third N-channel MOS inverter transistor 142 is connected to the negative voltage rail 122. The drain of third P-channel MOS inverter transistor 140 is connected to the positive voltage rail 106 through first P-channel MOS switching transistor 144, having its gate connected to second clock node 120.

A fourth inverter comprises fourth P-channel MOS inverter transistor 146, having its source connected to the drain of first P-channel MOS switching transistor 144 and its drain connected to the drain of fourth N-channel MOS inverter transistor 148 to form the output node of the fourth inverter and one of the complementary data output nodes 154 of the register stage. The gates of inverter transistors 146 and 148 are connected together to form the input node of the fourth inverter.

The third and fourth inverters are cross coupled. The gates of third inverter transistors 140 and 142 are connected to the drains of fourth MOS inverter transistors 146 and 148. In addition, the gates of fourth inverter transistors 146 and 148 are connected to the drains of third MOS inverter transistors 140 and 142.

First and second N-channel MOS pass transistors 150 and 152 connect the output nodes of the first and second inverters to the input nodes of the third and fourth inverters. The gates of first and second N-channel MOS pass transistors 150 and 152 are connected together to second clock node 120.

It may be seen that a number of parallel-loadable shift register stages 100 may be cascaded by connecting their complementary data input nodes 132 and 134 to the output nodes 154 and 156 of the third and fourth inverters of the preceding shift register stage. The first clock nodes 116 of all stages may be connected together to form a single parallel load input and the second clock nodes 120 of all stages may be connected together to form a shift clock.

While embodiments and applications of this invention have been shown and described, it would be apparent to those skilled in the art that many more modifications than mentioned above are possible without departing from the inventive concepts herein. For example, while the illustrative embodiments disclosed herein have been specifically described, those of ordinary skill in the art will readily recognize that a working embodiment could be realized by merely reversing the polarities of the transistors and power supply. Other modifications will readily suggest themselves to those of ordinary skill in the art. The invention, therefore, is not to be restricted except by the appended claims.

What is claimed is:

1. A static CMOS single phase register, including:
   a first power supply rail;
   a second power supply rail;
   a single clock node;
   first and second complementary data input nodes;
   first and second complementary data output nodes;
   a first inverter comprising a first MOS inverter transistor of a first conductivity type having its source connected to said first power supply rail and a first MOS inverter transistor of a second conductivity type having its gate connected to the gate of said first MOS inverter transistor of said first conductivity type, its drain connected to the drain of said first MOS inverter transistor of said first conductivity type and its source connected to the drain of an MOS switching transistor of said second conductivity type, the source of said MOS switching transistor of said second conductivity type connected to said second power supply rail and the gate of said MOS switching transistor of said second conductivity type connected to said clock node;
   a second inverter comprising a second MOS inverter transistor of said first conductivity type having its source connected to said first power supply rail and a second MOS inverter transistor of said second conductivity type having its gate connected to the gate of said second MOS inverter transistor of said first conductivity type, its drain connected to the drain of said second MOS inverter transistor of said first conductivity type and its source connected to the drain of said MOS switching transistor of said second conductivity type, the gates of said second MOS inverter transistors of said first and second conductivity types connected to the drains of said first MOS inverter transistors of said first and second conductivity types, and the gates of said first MOS inverter transistors of said first and second conductivity types connected to the drains of said second MOS inverter transistors of said first and second conductivity types;

a first MOS pass transistor of said first conductivity type having its gate connected to said clock node, its source connected to said first complementary data input node and its drain connected to the gates of said first MOS inverter transistors of said first and second conductivity types;

a second MOS pass transistor of said first conductivity type having its gate connected to said clock node, its source connected to said second complementary data input node and its drain connected to the gates of said second MOS inverter transistors of said first and second conductivity types;

a third inverter comprising a third MOS inverter transistor of said second conductivity type having its source connected to said second power supply rail and a third MOS inverter transistor of said first conductivity type having its gate connected to the gate of said third MOS inverter transistor of said second conductivity type, its drain connected to the drain of said third MOS inverter transistor of said second conductivity type and to said second complementary data output node, and its source connected to the drain of an MOS switching transistor of said first conductivity type, the source of said MOS switching transistor of said first conductivity type connected to said first power supply rail and the gate of said MOS switching transistor of said first conductivity type connected to said clock node;

a fourth inverter comprising a fourth MOS inverter transistor of said second conductivity type having its source connected to said second power supply rail and a fourth MOS inverter transistor of said first conductivity type having its gate connected to the gate of said fourth MOS inverter transistor of said second conductivity type, its drain connected to the drain of said fourth MOS inverter transistor of said second conductivity type and to said first complementary data output node, and its source connected to the drain of said MOS switching transistor of said first conductivity type, the gates of said third MOS inverter transistors of said first and second conductivity types connected to the drains of said fourth MOS inverter transistors of said first and second conductivity types, and the gates of said fourth MOS inverter transistors of said first and second conductivity types connected to the drains of said third MOS inverter transistors of said first and second conductivity types;

a first MOS pass transistor of said second conductivity type having its gate connected to said clock node, its drain connected to the drains of said second MOS inverter transistors of said first and second conductivity types and its source connected to the gates of said third MOS inverter transistors of said first and second conductivity types; and a second MOS pass transistor of said second conductivity type having its gate connected to said clock node, its drain connected to the drains of said first MOS inverter transistors of said first and second conductivity types and its source connected to the gates of said fourth MOS inverter transistors of said first and second conductivity types.

2. The CMOS single phase register of claim 1 wherein the MOS transistors are sized such that the saturation current of the series combination of said MOS switching transistor of said first conductivity type and said third or fourth MOS inverter transistor of said first conductivity type is greater than the saturation current of each of said first and second MOS pass transistors of said first conductivity type and the saturation current of the series combination of said MOS switching transistor of said second conductivity type and said first or second MOS inverter transistor of said second conductivity type is greater than the saturation current of each of said first and second MOS pass transistors of said second conductivity type.

3. A static N stage serial shift register, each stage including a CMOS single phase register of claim 1, said N stages cascaded such that the first and second complementary data input nodes of the CMOS single phase register of each stage are connected to the first and second complementary data output nodes of the CMOS single phase register of the preceding stage and wherein the clock nodes of all N CMOS single phase registers are connected together to a shift clock node.

4. A static CMOS parallel-loadable input stage for a shift register stage, including:
   a first power supply rail;
   a second power supply rail;
   a first clock node;
   a second clock node;
   first and second complementary data input nodes;
   third and fourth complementary data input nodes;
   first and second complementary data output nodes;
   a first inverter comprising a first MOS inverter transistor of a first conductivity type having its source connected to said first power supply rail and a first MOS inverter transistor of a second conductivity type having its gate connected to the gate of said first MOS inverter transistor of said first conductivity type, its drain connected to the drain of said first MOS inverter transistor of said first conductivity type and to said first complementary data output node;
   first and second MOS switching transistors of said second conductivity type connected in series between the sources of said first and second MOS inverter transistors of said second conductivity type and said second power supply rail, the gate of one of said first and second MOS switching transistors of said second conductivity type connected to said first clock node and the gate of the other one of said first and second MOS switching transistors of said second conductivity type connected to said second clock node;
   a second inverter comprising a second MOS inverter transistor of said first conductivity type having its source connected to said first power supply rail and a second MOS inverter transistor of said second conductivity type having its gate connected to the gate of said second MOS inverter transistor of said first conductivity type, its drain connected to the drain of said second MOS inverter transistor of said first conductivity type and to said first complementary data output node, and its source connected to the drain of said first MOS switching transistor of said second conductivity type, the gates of said second MOS inverter transistors of said first and second conductivity types connected to the drains of said first MOS inverter transistors of said first and second conductivity types, and the gates of said first MOS inverter transistors of said first and second conductivity types connected to the drains of said second MOS inverter transistors of said first and second conductivity types;

a first MOS pass transistor of said first conductivity type having its gate connected to said first clock node, its source connected to said first complementary data input and its drain connected to the gates of said first MOS inverter transistors of said first and second conductivity types;

a second MOS pass transistor of said first conductivity type having its gate connected to said first clock node, its source connected to said second complementary data input and its drain connected to the gates of said second MOS inverter transistors of said first and second conductivity types;

a third MOS pass transistor of said first conductivity type having its gate connected to said second clock node, its source connected to said third complementary data input and its drain connected to the gates of said first MOS inverter transistors of said first and second conductivity types; and a fourth MOS pass transistor of said first conductivity type having its gate connected to said second clock node, its source connected to said fourth complementary data input and its drain connected to the gates of said second MOS inverter transistors of said first and second conductivity types.

5. A static CMOS parallel-loadable register stage, including:

a first power supply rail;
a second power supply rail;
a first clock node;
a second clock node;
first and second complementary data input nodes;
third and fourth complementary data input nodes;
first and second complementary data output nodes;

a first inverter comprising a first MOS inverter transistor of a first conductivity type having its source connected to said first power supply rail and a first MOS inverter transistor of a second conductivity type having its gate connected to the gate of said first MOS inverter transistor of said first conductivity type, its drain connected to the drain of said first MOS inverter transistor of said first conductivity type;

a first MOS switching transistor of said second conductivity type having its drain connected to the source of said first MOS inverter transistor of said second conductivity type and its gate connected to one of said first and second clock nodes;

a second MOS switching transistor of said second conductivity type having its drain connected to the source of said first MOS switching transistor of said second conductivity type, its gate connected to the other one of said first and second clock nodes, and its source connected to said second power supply rail;

a second inverter comprising a second MOS inverter transistor of said first conductivity type having its source connected to said first power supply rail and a second MOS inverter transistor of said second conductivity type having its gate connected to the gate of said second MOS inverter transistor of said first conductivity type, its drain connected to the drain of said second MOS inverter transistor of said first conductivity type and its source connected to the drain of said first MOS switching transistor of said second conductivity type, the gates of said second MOS inverter transistors of said first and second conductivity types connected to the drains of said first MOS inverter transistors of said first and second conductivity types, and the gates of said first MOS inverter transistors of said first and second conductivity types connected to the drains of said second MOS inverter transistors of said first and second conductivity types;

a first MOS pass transistor of said first conductivity type having its gate connected to said first clock node, its source connected to said first complementary data input and its drain connected to the gates of said first MOS inverter transistors of said first and second conductivity types;

a second MOS pass transistor of said first conductivity type having its gate connected to said first clock node, its source connected to said second complementary data input and its drain connected to the gates of said second MOS inverter transistors of said first and second conductivity types;

a third MOS pass transistor of said first conductivity type having its gate connected to said second clock node, its source connected to said third complementary data input and its drain connected to the gates of said first MOS inverter transistors of said first and second conductivity types;

a fourth MOS pass transistor of said first conductivity type having its gate connected to said second clock node, its source connected to said fourth complementary data input and its drain connected to the gates of said second MOS inverter transistors of said first and second conductivity types;

a third inverter comprising a third MOS inverter transistor of said second conductivity type having its source connected to said second power supply rail and a third MOS inverter transistor of said first conductivity type having its gate connected to the gate of said third MOS inverter transistor of said second conductivity type, its drain connected to the drain of said third MOS inverter transistor of said second conductivity type and to said second complementary data output node, and its source connected to the drain of an MOS switching transistor of said first conductivity type, the source of said MOS switching transistor of said first conductivity type connected to said first power supply rail and the gate of said MOS switching transistor of said first conductivity type connected to said second clock node;

a fourth inverter comprising a fourth MOS inverter transistor of said second conductivity type having its source connected to said second power supply rail and a fourth MOS inverter transistor of said first conductivity type having its gate connected to the gate of said fourth MOS inverter transistor of said second conductivity type, its drain connected to the drain of said fourth MOS inverter transistor of said second conductivity type and to said first complementary data output node, and its and its source connected to the drain of said MOS switching transistor of said first conductivity type, the gates of said third MOS inverter transistors of said first and second conductivity types connected to the drains of said fourth MOS inverter transistors of said first and second conductivity types, and the gates of said fourth MOS inverter transistors of said first and second conductivity types connected to the drains of said third MOS inverter transistors of said first and second conductivity types;

a first MOS pass transistor of said second conductivity type having its gate connected to said second clock node, its drain connected to the drains of said second MOS inverter transistors of said first and second conductivity types and its source connected to the gates of said third MOS inverter transistors of said first and second conductivity types; and a second MOS pass transistor of said second conductivity type having its gate connected to said second clock node, its drain connected to the drains of said first MOS inverter transistors of said first and second conductivity types and its source connected to the gates of said fourth MOS inverter transistors of said first and second conductivity types.

6. The static CMOS parallel-loadable register stage of claim 5 wherein the MOS transistors are sized such that the saturation current of the series combination of said MOS switching transistor of said first conductivity type and said third or fourth MOS inverter transistor of said first conductivity type is greater than the saturation current of each of said first, second, third and fourth MOS pass transistors of said first conductivity type and the saturation current of the series combination of said first and second MOS switching transistor of said second conductivity type and said first or second MOS inverter transistor of said second conductivity type is greater than the saturation current of each of said first and second MOS pass transistors of said second conductivity type.

7. An N stage parallel-loadable serial shift register, each stage including a CMOS parallel-loadable register stage of claim 5, said N stages cascaded such that one pair of the first and second and the third and fourth complementary data input nodes of the CMOS single phase register of each stage are connected to the first and second complementary data output nodes of the CMOS single phase register of the preceding stage and wherein a parallel data input of each stage comprises the other pair of the first and second and the third and fourth complementary data input nodes of the CMOS single phase register of that stage, and wherein one of the first and second clock nodes of all N CMOS single phase registers are connected together to a shift clock node.

8. The N stage parallel-loadable serial shift register of claim 7 further including a load clock node connected to the other one of the first and second clock nodes of all N CMOS single phase registers.

* * * * *